(12) United States Patent
Miyase et al.

(10) Patent No.: US 8,429,472 B2
(45) Date of Patent: Apr. 23, 2013

(54) GENERATING DEVICE, GENERATING METHOD, AND PROGRAM

(75) Inventors: Kohei Miyase, Iizuka (JP); Xiaoqing Wen, Iizuka (JP); Seiji Kajihara, Iizuka (JP); Yuta Yamato, Iizuka (JP)

(73) Assignee: National University Corporation Kyushu University Institute of Technology, Fukuoka (JP)

( * ) Notice: Subject to any disclaimer, the term of this patent is extended or adjusted under 35 U.S.C. 154(b) by 178 days.

(21) Appl. No.: 13/059,541

(22) PCT Filed: Jul. 30, 2009

(86) PCT No.: PCT/JP2009/063586
§ 371 (c)(1),
(2), (4) Date: Feb. 17, 2011

(87) PCT Pub. No.: WO2010/021233
PCT Pub. Date: Feb. 25, 2010

(65) Prior Publication Data
US 2011/0140734 A1    Jun. 16, 2011

(30) Foreign Application Priority Data
Aug. 20, 2008    (JP) .................................. 2008-211473

(51) Int. Cl.
*G01R 31/28*    (2006.01)

(52) U.S. Cl.
USPC ............................ 714/726; 714/728; 714/731

(58) Field of Classification Search .................. 714/726, 714/727, 728, 731, 733, 738, 715
See application file for complete search history.

(56) References Cited

U.S. PATENT DOCUMENTS
6,986,090 B2 * 1/2006 Hathaway et al. ............. 714/727
7,203,876 B2 * 4/2007 Allen et al. .................... 714/726

* cited by examiner

*Primary Examiner* — Fritz Alphonse
(74) *Attorney, Agent, or Firm* — Rankin, Hill & Clark LLP

(57) ABSTRACT

Provided are a generation device to reduce launch switching activity, yield loss risk, and power consumption of testing, even in the at-speed scan testing, even with a small number of don't-care (X) bits in input bits as in test compression, without any impact on test data volume, fault coverage, performance, and circuit design, by putting focus on internal lines in the circuit. The generation device includes a target internal line selection unit, a target internal line distinction unit, an identification unit that identifies a bit to be an unspecified bit and a bit to be a logic bit in the input bits, and an assignment unit that assigns a logic value 1 or a logic value 0 to unspecified bits in the input bits. The identification unit includes an unspecified bit identification unit and an input logic bit identification unit.

7 Claims, 20 Drawing Sheets

| Circuit | # of Gates | # of FF's | # of Clock-Gated FF's | % of Clock-Gated FF's | # of Clock Gating Blocks | Ave. # FF's / Clock Gating Block |
|---|---|---|---|---|---|---|
| TC-1 | 207.8K | 6,992 | 5,532 | 79.4% | 3,441 | 1.6 |
| TC-2 | 191.5K | 6,992 | 2,176 | 31.1% | 65 | 33.5 |

(B)

| Circuit | # of Vec. | Fault Cov. (%) | Reduction Ratio of Launch Switching Activity | | |
|---|---|---|---|---|---|
| | | | XID +Preferred | XID +JP | CTX |
| TC-1 | 4025 | 84.7 | 15.2 | 15.9 | 23.9 |
| TC-2 | 3575 | 87.8 | 15.6 | 17.2 | 17.4 |

Fig.12 Prior Art test cube $C_1$ 0 X 0 X 1
$C_2$ 1 X 0 1 1
$C_3$ 0 0 X 1 0 test vector $v_1$ 0 1 0 0 1
$v_2$ 1 1 0 1 1
$v_3$ 0 0 0 1 0

GENERATING DEVICE, GENERATING METHOD, AND PROGRAM

TECHNICAL FIELD

The present invention relates to a generation device, a generation method, and a program, and particularly relates to a generation device, a generation method, and a program for testing a circuit such as a combinational circuit, a combinational portion of a full scan sequential circuit or the like.

BACKGROUND ART

As shown in FIG. 9, a semiconductor logic circuit is shipped through three stages, which are designing, manufacturing and testing stages. In the testing stage, a test vector, wherein the logic value of each logic bit is determined as either 0 or 1, is applied to the manufactured semiconductor logic circuit, and a test response from the semiconductor logic circuit is observed and compared to an expected test response, so that it is judged if the circuit is defective or defect-free. A ratio by which the defect-free products can be obtained is called the yield, and the yield largely affects the quality, reliability and manufacturing costs of the semiconductor logic circuit.

FIG. 10 illustrates a full scan sequential circuit of a common logic circuit.

In general, the manufactured semiconductor logic circuit is mostly a sequential circuit. The sequential circuit comprises a combinational circuit portion 1201 including one or a plurality of logic elements such as AND gates, NAND gates, OR gates, NOR gates and the like, and flip-flops 1203 for memorizing internal states of the circuit. Hereupon, the combinational circuit portion 1201 comprises an primary input (PI), a pseudo primary input (PPI) which is an output of the flip-flop, an primary output (PO), and a pseudo primary output (PPO) which is an input of the flip-flop. Inputs to the combinational circuit portion 1201 include those directly supplied from the primary input and those supplied via the pseudo primary input. Outputs from the combinational circuit portion 1201 include those appearing on the primary output directly and those appearing on the pseudo primary output.

In order to test the combinational circuit portion 1201 of the sequential circuit, it is necessary to apply a required test vector from the primary input and the pseudo primary input of the combinational circuit portion 1201 and observe a test response f(v) from the primary output and the pseudo primary output of the combinational circuit portion 1201. Bits corresponding to the primary input and the pseudo primary input constitute one test vector, and bits corresponding to the primary output and the pseudo primary output constitute one test response.

However, in general, the output (pseudo primary input) and the input (pseudo primary output) of the flip-flop 1203 of the sequential circuit cannot be directly accessed from outside. Therefore, there are problems in the controllability of the pseudo primary input and the observability of the pseudo primary output when the combinational circuit portion 1201 is tested.

A method of solving the problems described above in the controllability and observability in the test of the combinational circuit portion 1201 which is mostly adopted is the full scan design. Describing the full scan design, the flip-flops are replaced with scan flip-flops, and the scan flip-flops are used to form one or a plurality of scan chains. The operation of the scan flip-flops is controlled by a scan enable (SE) signal. For example, when SE=0, the operation of the scan flip-flops is the same as that of the conventional flip-flops, and output values of the scan flip-flops are updated by a value from the combinational circuit portion 1201 when a clock pulse is given thereto. When SE=1, the scan flip-flop and another scan flip-flop in the same scan chain form one shift register, and new values are shifted into the scan flip-flops from outside and current values in the scan flip-flops are shifted out therefrom when the clock pulse is given thereto. In general, the scan flip-flops in the same scan chain share the same scan enable (SE) signal, however, the scan flip-flops in the different scan chains may share the same scan enable (SE) signal or may respectively use different ones.

The combinational circuit portion of the full scan sequential circuit is tested in such a manner that scan shift and scan capture are repeated. The scan shift is performed in shift mode wherein the scan enable (SE) signal is set to logic value 1. In the shift mode, one or a plurality of clock pulses is given, and one or a plurality of new values is shifted into the scan flip-flops in the scan chain from outside, and, at the same time, one or a plurality of current values in the scan flip-flops in the scan chain is shifted out therefrom. The scan capture is performed in capture mode wherein the scan enable (SE) signal is set to logic value 0. In the capture mode, one clock pulse is simultaneously given to all of the scan flip-flops in one scan chain, and the values of the pseudo primary outputs in the combinational circuit portion 1201 are captured into all of the scan flip-flops.

The scan shift is used in order to apply the test vector to the combinational circuit portion 1201 via the pseudo primary input and in order to observe the test response from the combinational circuit portion 1201 via the pseudo primary output. The scan capture is used to capture the test response from the combinational circuit portion 1201 into the scan flip-flops.

By repeating the scan shift and the scan capture for all of the test vectors, the combinational circuit portion 1201 can be tested. Such a test method is called the scan test method.

In the scan test method, the test vector is applied to the combinational circuit portion 1201 directly via the external input and the scan shift. Because an arbitrary logic value can be set in an arbitrary scan flip-flop by the scan shift, the problem in the controllability of the pseudo primary input can be solved. The test response from the combinational circuit portion 1201 is observed directly via the external output and the scan shift. Because the output value of the arbitrary scan flip-flop can be observed by the scan shift, the problem in the observability of the pseudo primary output can be solved. As described, it is only required in the scan test method to obtain the test vector and the expected test response using an automatic test pattern generation (ATPG) program.

FIG. 11 illustrates the relationship between the test input and the test response.

Referring to FIG. 11, when a test vector has an unspecified value X (a don't-care (X) which can be either a logic value 1 or a logic value 0), its test response may have an unspecified value X (a don't-care (X)). The unspecified value exists because it is necessary that only a part of test input bits are determined in order to detect one or a plurality of faults. The set which has a don't-care, which can be either logic value 1 or logic value 0 for achieving a predetermined object such as detecting faults, is called a test cube. A test cube can be obtained by ATPG or by a don't-care identification method. A don't-care can be assigned by either logic value 1 or a logic value 0. An example of techniques for identifying a don't-care bit in a test input is proposed in the patent document 1 by the inventors of the present application.

The patent document 1 discloses a technique of setting a candidate bit which can be a don't-care bit to satisfy a condition based on an input-output relationship in a logic circuit, and a fixed bit which cannot be a don't-care bit to satisfy the condition. The patent document 1 also discloses a technique of assigning logic values to a test cube including don't-care bits considering the relationship between a plurality of bit pairs consisting of input bits and output bits.

Another example of don't-care identification techniques is disclosed in the patent document 2 by the inventors of the present invention.

The patent document 2 discloses a technique for a test pattern detecting not only a stuck-at fault as in the previous art but also a transition delay fault. The technique reduces the size of a test pattern by test compaction and reduces the test application time.

Here, a test cube and a test vector are described. Referring to FIG. 12, a test cube includes c1, c2 and c3 which includes a don't-care bit denoted by X. A test vector set is a set consisting of test vectors consisting of logic bits which are either logic value 0 or logic value 1.

Next, the process of obtaining a test cube is described. FIG. 13 illustrates the concept of obtaining a test cube and an example of test data manipulation. FIG. 14 illustrates a simple example of test relaxation (don't-care identification).

Referring to FIG. 13, a don't-care is denoted by X, a bit which can be either logic value 0 or logic value 1 for achieving a predetermined object such as fault detection. A test cube can be obtained by means of a dynamic technique which leaves the don't-care bits during test generation by ATPG and by means of a static technique which is called test relaxation by which the don't-care bits identifiable as don't-care are found after ATPG. The logic values of such a test cube are determined (X-Filling), resulting in a test vector set which consists of test vectors where the logic values are filled either with the logic value 0 or with the logic value 1. In what follows, the assignment of logic values to the don't-care bits is determined so that the changes of signal values at scan capture are reduced. The static technique is also applied to a compacted test vector set and the amount of test data is reduced.

Referring to FIG. 14, fault simulation, implication, justification are used for the test relaxation where the bits identifiable as don't-care included in a test cube are found, and the don't-care bits are found under a constraint. Such a constraint is generally to adjust the failure coverage of a specific fault model. Usually, 60 to 90% out of the bits can be identified as don't-care. On the other hand, in what follows, the constraint which doesn't change the failure coverage is possible. The original test vector set may be given as a compacted test vector set by dynamic compaction or random-fill.

At-speed scan testing is mandatory for improving timing-related test quality. It is realized by launching a transition at the start-point of a path and capturing its response at the end-point of the path at the system speed. In practice, the launch-on-capture (LOC) clocking scheme is widely used for at-speed scan testing.

FIG. 15 illustrates an LOC clocking scheme.

Referring to FIG. 15, after a test vector is loaded by a series of shift clock pulses with $S_L$ being the last one (L: the length of the longest scan chain), transitions are launched by the first capture clock pulse $C_1$ at the corresponding scan FFs. The transitions are caused by the difference between the values shifted-in by $S_L$ and the values captured by $C_1$. The test cycle between the transition launch ($C_1$) and the response capture ($C_2$) is the rated system clock period.

Although at-speed scan testing is indispensable for improving timing-related test quality, its applicability is being severely challenged by test-induced yield loss, which occurs when functionally good chips fail only during at-speed scan testing. The major cause for this problem is power supply noise, i.e., IR-drop and ground bounce, caused by excessive launch switching activity at $C_1$, which results in delay increase. It has been shown that a 10% drop in power supply voltage can increase path delay by 30%. Obviously, this may result in capture failures at $C_2$, thus leading to test-induced yield loss. This problem is deteriorating rapidly for deep-submicron and low-power chips. Therefore, there is a strong need to reduce the yield loss risk induced by excessive power supply noise.

Previous techniques for reducing launch switching activity are based on the following three approaches.

(1) Partial Capture: The number of FFs that capture at $C_1$ (FIG. 1) can be reduced by circuit modification, one-hot clocking, or capture clock staggering. However, this approach may incur significant ATPG change, test data inflation, and even fault coverage loss.

(2) Low-Capture-Power ATPG: 0's and 1's in a test vectors can be carefully generated so that launch switching activity is reduced by such techniques as input-output equalizing at FFs, clock-gating, etc. However, this approach may suffer from significant test data inflation and long CPU time.

(3) Test Relaxation & X-Filling: Test relaxation is to identify don't-care bits (X-bits) from a set of fully-specified test vectors without any fault coverage loss. Then, X-filling is conducted on the resulting partially-specified test cubes to make as many FFs as possible to have equal input and output values. This way, launch switching activity is reduced.

The concept of test relaxation & X-filling is illustrated in FIG. 16.

First, test relaxation is described. As illustrated in FIG. 16, test relaxation is the process of identifying don't-care bits (X-bits) from a fully-specified test vector set V to create a partially-specified test cube set C, while guaranteeing that some properties of V are preserved by C. Such properties include stuck-at fault coverage, transition delay fault coverage, and even all sensitized paths for transition delay fault detection.

X-bits can also be obtained directly from test generation by disabling random-fill. However, this increases ATPG time and test data volume. For example, the test vector count increased by 144.8% when random-fill was disabled to leave X-bits for low-power X-filling. Thus, it is preferable to apply maximum test compaction with random-fill to generate a compacted initial (fully-specified) test set first, and then use test relaxation to create (partially-specified) test cubes. This results in a compacted final test set with additional benefits after X-filling is conducted.

Next, X-filling is described. As illustrated in FIG. 16, X-filling is the process of assigning logic values to the X-bits in a test cube for a specific purpose. For example, X-filling is used for reducing launch switching activity (LSA), which occurs at $C_1$ (FIG. 15). Many low-LSA X-filling techniques have been proposed.

FIG. 17 illustrates one of the low-LSA X-filling techniques, called JP-fill.

In FIG. 17, the test cube is c=<10XX> and the logic function of the combinational portion is F. Thus, <c: PPI>=<0XX> and <F(c): PPO>=<XXX>. First, justification (circle 1 in FIG. 17) is conducted to try to set 0 to $p_2$ since $p_1$ is 0. Then, for the $q_1$-$q_2$ and $r_1$-$r_2$ bit-pairs of the form X-X, the 0 and 1 probabilities of each PPO X-bit are calculated by setting 0.50 as the 0 and 1 probabilities for each input X-bit and conducting probability propagation. Since the 0-probability (0.93) of $q_2$ is significantly larger than its 1-probability (0.07), it is reasonable to assign 0 to $q_1$ (circle 2 in FIG. 17). However, since the 0-probability (0.49) of $r_2$ is close to its 1-probability (0.51), no decision is made for $r_1$ (circle 3 in FIG. 17). In this case, 3-valued logic simulation is conducted, and one more pass of JP-Fill (circle 4 in FIG. 17) is conducted with justification and/or probability propagation. In essence, JP-fill uses justification and multiple passes to improve the effectiveness of X-filling, while its scalability is improved by probability propagation. This way, JP-fill achieves effectiveness and scalability in a balanced manner.

FIG. 18 illustrates an example of clock-gating schemes. Clock-gating is the most widely used power management mechanism in practice. A circuit may contain multiple clock-gating blocks. FIG. 18 shows the i-th one, which is enhanced for scan testing. In shift mode (SE=1), all FFs are constantly driven by the clock CK so that the shift operation is properly conducted. The clock-control signal ($EN_i$) is generated at the rising edge of CK and takes over the control of $GEN_i$ in capture mode (SE=0). $GEN_i$ is then ANDed with CK to create the gated clock $GCK_i$ that is directly connected to the FFs. Clock-gating can be used to reduce launch switching activity in capture mode. This is achieved by setting $EN_i$ to 0 at the last shift pulse $S_L$. This way, the launch capture clock pulse ($C_L$ in FIG. 15) is suppressed as shown in FIG. 19, and all FFs controlled by $GCK_i$, i.e., $FF_1^i \sim FF_p^i$ as shown in FIG. 6, will not capture. That is, launch transitions at the FFs are reduced in a collective manner.

Definition: If the clock of a FF is a gated clock, the FF is called a clock-gated FF; otherwise, the FF is called a non-clock-gated FF. The group of FFs controlled by the same gated clock is called a clock-gated FF group. Note that all FFs connected through one clock tree are considered as one clock-gated FF group.

From the ATPG point of view, clock-gating can be utilized by the following two basic approaches.

Approach-1 (Detection-Oriented): Test generation is conducted in a manner that activates clocks to FFs (i.e., disabling clock-gating) as much as possible, in order to make more FFs available for launch and capture in transition fault detection. Most commercial ATPG systems use this approach explicitly or implicitly. This leads to a smaller test set, higher fault coverage, and shorter CPU time, at the cost of higher launch switching activity.

Approach-2 (Reduction-Oriented): In test generation, clock-gating can be aggressively used for reducing launch switching activity. However, this reduces the number of FFs available for launch and capture in transition fault detection, leading to test vector count inflation, longer CPU time, and even fault coverage loss under certain conditions.

As described above, GCK is the signal which decides whether a FF group is activated or inactivated. And the value of GCK is determined by a control signal $EN_i$ which controls clock-gating circuitry. Therefore, controlling a control signal $EN_i$ (or a signal GCK) leads to massive power reduction by inactivating FF groups.

A technique which tried to reduce power consumption by activating or inactivating a clock-gating circuitry is disclosed in a NON-PATENT DOCUMENT 1.

PRIOR ART DOCUMENTS

Patent Document

[Patent Document 1]: Japanese Unexamined Patent Application Publication No. 2007-155339.
[Patent Document 2]: WO 2008/001818.

NON-PATENT DOCUMENTS

[Non-Patent Document 1]: R. Illman, and two others, "ATPG power reduction using clock gate "default" constraints." First International Workshop on the Impact of Low-Power Design on Test and Reliability (fringe to ETS 2008), Proceedings LPonTR 2008, 29 May 2008, Hotel Majestic Pallanza, Lago Maggiore, Italy

SUMMARY OF THE INVENTION

Problem to be Solved by the Invention

However, any technique disclosed in PATENT DOCUMENT 1 considers only the relationship between input bits and output bits where the controllability of the pseudo primary input and the observability of the pseudo primary output are problems to be solved. And any technique disclosed in PATENT DOCUMENT 2, which enables don't-care identification, only puts focus on inputs (or pseudo inputs) and outputs (or pseudo outputs).

Furthermore, test relaxation & X-filling approach suffers from a major limitation: If the number of X-bits identified from a test set is small, its effect of launch switching activity reduction may be insufficient. Such X-bit shortage may be caused by test compaction or test compression. FIG. 20 shows an example of an industrial circuit (600K gates and 600 transition delay test vectors), for which test vectors obtained at the early stage of test generation have fewer (even less than 60%) X-bits.

Besides, the technique disclosed in NON-PATENT DOCUMENT 1 cannot preserve fault coverage and reduce power consumption at the same time. That is, reducing power consumption with the fault coverage preserved needs additional data, causing the size increase of test data volume. Reduction of power consumption can be realized by inactivating FF groups. But what comes first is detecting faults in testing and the properties of a finally obtained test vector such as fault coverage is crucially important. This is why detection-oriented approach-1 has been often applied in order to enhance fault coverage, resulting in more and more FF groups are activated. Therefore, a new method has been required which realizes power reduction, considering the properties such as fault coverage, without increasing the size of test data volume based on the reduction-oriented approach-2.

Particularly, at-speed scan testing is susceptible to yield loss risk due to power supply noise caused by excessive launch switching activity. So, there is a strong need to effectively reduce launch switching activity and eventually yield loss risk, even with a small number of don't-care (X) bits in input bits as in test compression, without any impact on test data volume, fault coverage, performance, and circuit design.

It is, therefore, an object of the present invention to reduce launch switching activity, yield loss risk, and power consumption of testing, even in the at-speed scan testing, even with a small number of don't-care (X) bits in input bits as in test compression, without any impact on test data volume, fault coverage, performance, and circuit design, by putting focus on internal lines in the circuit.

Means for Solving the Problem

A first aspect in accordance with the present invention provides a generation device for generating a new set from a given set with fault model of the given set preserved or with fault coverage of the given set preserved or enhanced, the given set comprising input bits to be applied to a logic circuit being the target of fault detection, the given set being a test vector set consisting of test vectors whose input bits are logic bits of logic value 1 or 0, a test cube set consisting of test cubes whose input bits include one or more unspecified bits whose logic values are not specified, or a combination set consisting of both test vectors and test cubes, comprising a target internal line selection unit that selects a signal line in the logic circuit;

a target internal line distinction unit that distinguishes the signal lines in the logic circuit in terms of logic values of the signal lines, and an identification unit that identifies an input bit that must remain as a logic bit and an input bit that can be an unspecified bit, wherein the signal line in the logic circuit is connected to a downstream circuit, and the identification unit achieves an effect on the signal lines which are selected by the target internal line selection unit and which are distinguished between a first target internal line, a second target internal line and a third target internal line by the target internal line distinction unit, with at least the fault model of the given set preserved or with fault coverage of the given set preserved or enhanced, the effect being (a) changing at least one designated logic value of the first target internal line into an unspecified value, the first target internal line being the signal line in the logic circuit with a logic value which activates the downstream circuit and which is the same as the logic value designated for the signal line, (b) keeping at least one logic value of the second target internal line, the logic value being different from the designated logic value for the second target internal line, the second target internal line being the signal line in the logic circuit with a logic value which inactivates the downstream circuit and which is different from the logic value designated for the signal line, or (c) keeping at least one unspecified value of the third target internal line or changing at least one unspecified value of the third target internal line into a logic value being different from the logic value designated for the third target internal line, the third target internal line being a signal line in the logic circuit with an unspecified value.

A second aspect in accordance with the present invention provides the generation device of the first aspect, wherein the downstream circuit is a flip-flop group and the target internal line in the logic circuit controls the flip-flop group.

A third aspect in accordance with the present invention provides the generation device of the second aspect, wherein further comprising an assignment unit that assigns a logic value 1 or 0 to an unspecified input bit including unspecified bit identified by the identification device, wherein the assignment unit assigns a logic value 1 or 0 to an unspecified input bit so that (a) a logic value different from the logic value designated for the first target internal line whose value can be changed into an unspecified logic value appears at the first target internal line or (b) a logic value different from the logic value designated for the third target internal line appears at the third target internal line.

A fourth aspect in accordance with the present invention provides a generation method for generating a new set from a given set with fault model of the given set preserved or with fault coverage of the given set preserved or enhanced, the given set comprising input bits to be applied to a logic circuit being the target of fault detection, the given set being a test vector set consisting of test vectors whose input bits are logic bits of logic value 1 or 0, a test cube set consisting of test cubes whose input bits include one or more unspecified bits whose logic values are not specified, or a combinational set consisting of both test vectors and test cubes, comprising the steps of selecting a signal line in the logic circuit, distinguishing the signal lines in the logic circuit in terms of logic values of the signal lines, and identifying an input bit that must remain as a logic bit and an input bit that can be an unspecified bit, wherein the signal line in the logic circuit is connected to a downstream circuit, and the identifying achieves an effect on the signal lines which are selected in the selecting and which are distinguished between a first target internal line, a second target internal line and a third target internal line in the distinguishing, with at least the fault model of the given set preserved or with fault coverage of the given set preserved or enhanced, the effect being (a) changing at least one designated logic value of the first target internal line into an unspecified value, the first target internal line being the signal line in the logic circuit with a logic value which activates the downstream circuit and which is the same as the logic value designated for the signal line, (b) keeping at least one logic value of the second target internal line, the logic value being different from the designated logic value for the second target internal line, the second target internal line being the signal line in the logic circuit with a logic value which inactivates the downstream circuit and which is different from the logic value designated for the signal line, or (c) keeping at least one unspecified value of the third target internal line or changing at least one unspecified value of the third target internal line into a logic value being different from the logic value designated for the third target internal line, the third target internal line being a signal line in the logic circuit with an unspecified value.

It is described that "at least one" of second target internal lines is processed in the identification process of the first aspect and the fourth aspect of the present invention. However, it is preferable to keep as many different logic values of second target internal lines as possible. And it is more preferable to keep all the different logic values of second target internal lines. Similarly, it is described that "at least one" of third target internal lines is processed in the identification process. However, it is preferable to keep as many unspecified values as possible or to change as many unspecified values into the different logic values. And it is more preferable that all the unspecified values of the third target internal lines are kept or changed into the different logic values. Additionally, it is described that "the identification achieves an effect" among three effects. However, it is preferable to achieve all the effects, though it may be not possible to achieve the effect of the third target internal line in case there is no unspecified value.

A fifth aspect in accordance with the present invention provides the generation method of the fourth aspect, wherein the downstream circuit is a flip-flop group and the target internal line in the logic circuit controls the flip-flop group.

A sixth aspect in accordance with the present invention provides the generation method of the fifth aspect, further comprising the step of assigning a logic value 1 or 0 to an unspecified input bit including unspecified bit identified in the identifying so that (a) a logic value different from the logic value designated for the first target internal line whose value can be changed into an unspecified logic value appears at the first target internal line or (b) a logic value different from the logic value designated for the third target internal line appears at the third target internal line.

The examples of signal lines which control flip-flop groups, in accordance with the second, third, fifth, and sixth aspect of the present invention, include a clock-control signal line and a gated clock signal line.

A seventh aspect in accordance with the present invention provides a program capable of causing a computer to execute the generation method according to any of claim 4 through 6.

Effect of the Invention

According to the present invention, it is made possible to distinguish target internal lines and judge which target internal line a signal line in the logic circuit is. And it is also made possible to identify a bit which must remain as a logic bit and a bit which can be an unspecified bit in the input bits in order that a designated logic value of a first target internal line is changed into an unspecified value or that the logic value of a second target internal line or a third target internal line is a logic value being different from the logic value designated for each line. As a result, a new set including a test cube which can control a target internal line, especially a first target internal line, without changing the size of the given set, without deteriorating the property of the given set.

Consequently, if the signal line in the logic circuit is the signal line which controls whether a flip-flop group is activated or inactivated, it is made possible to inactivate many flip-flops by making as many signal lines inactivate flip-flop groups as possible, resulting in reducing power consumption in testing.

Besides, it is made possible to reduce launch switching activity and yield loss risk, even in the at-speed scan testing, even with a small number of don't-care (X) bits in input bits as in test compression, without any impact on test data volume, fault coverage, performance, and circuit design.

BRIEF DESCRIPTION OF THE DRAWINGS

FIG. 7 illustrates two tables showing experimental results.

FIG. 12 illustrates an example of a test cube and a test vector.

MODES FOR CARRYING OUT THE INVENTION

Figure 1:
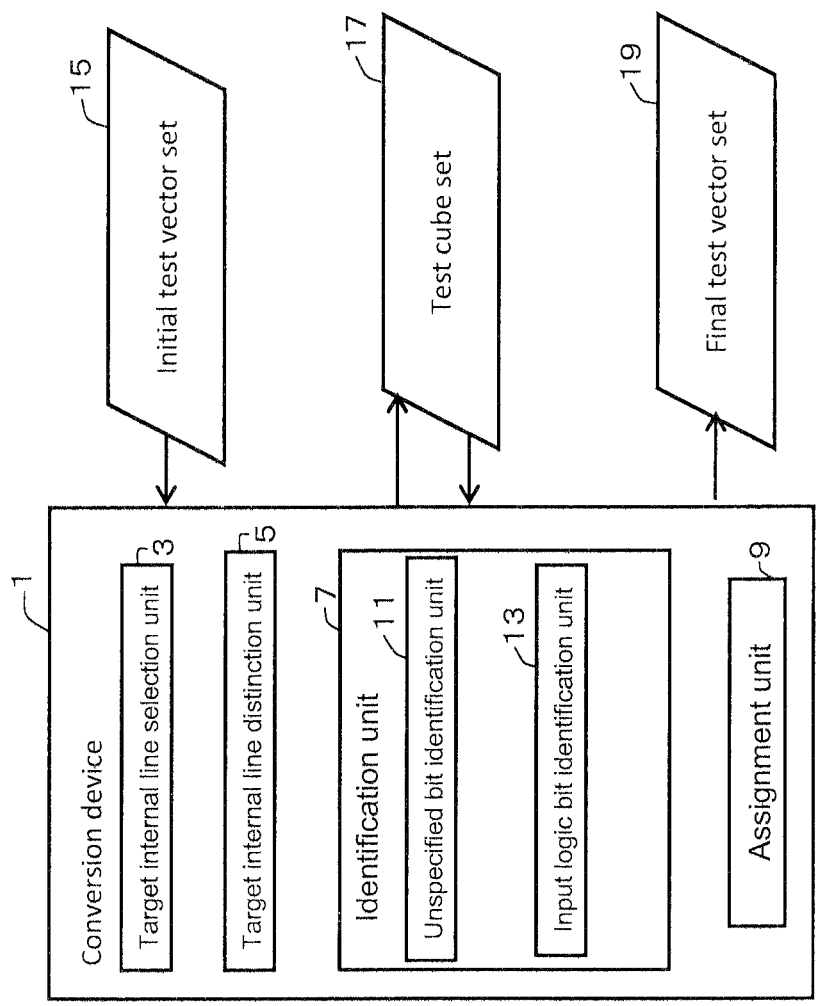
FIG. 1 shows a schematic block diagram of a conversion device which can perform a test cube set generation method in accordance with an embodiment of the present invention.

FIG. 1 shows a schematic block diagram of a conversion device which can perform a test cube set generation method in accordance with an embodiment of the present invention.

Referring to FIG. 1, this conversion device 1 includes a target internal line selection unit 3 that selects a signal line in the logic circuit being the target of fault detection, a target internal line distinction unit 5 that distinguishes the selected signal lines in the logic circuit as described below, an identification unit 7 that identifies a bit which can be an unspecified bit and a bit which must remain as a logic bit in the input bits, and an assignment unit 9 that assigns a logic value 1 or a logic value 0 to unspecified bits in the input bits, the unspecified bits including an identified unspecified bit. The identification unit 7 includes an unspecified bit identification unit 11 and an input logic bit identification unit 13. The conversion device 1 with such a composition can convert an initial test vector set 15, which is an example of a given set to input bits, into a test cube set 17, which is an example of a new set. Further, the conversion device 1 can convert the test cube set 17 into a final test vector set 19 to generate a set to be applied into the logic circuit being the target of fault detection.

The examples of the target signal lines in the logic circuit selected by the target internal line selection unit 3 include a clock-control signal line connected into a clock-gating circuitry which can decide whether its downstream flip-flop group is activated or inactivated. The target internal line distinction unit 5 distinguishes the case such a clock-control signal line has a logic value 1 (0) from the case it has a logic value 0 (1). As an example, clock-control signal lines having logic value 1 are referred to as first target internal lines and clock-control signal lines having logic value 0 are referred to as second target internal lines. In addition, if an unspecified value (don't-care) is included in the given set, the target internal line identification unit 5 can further distinguish the clock-control signal lines having an unspecified value X as third target internal lines.

Figure 2:
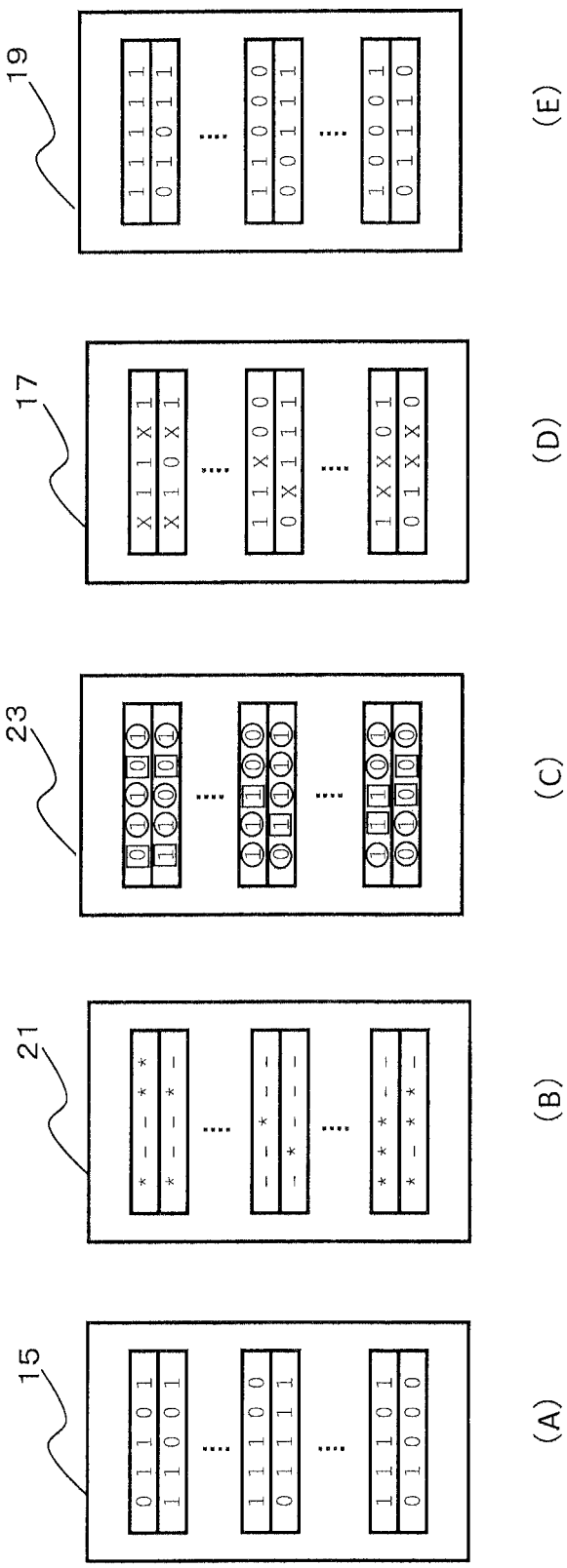
FIG. 2 illustrates a specific behavior of the conversion device in accordance with FIG. 1.

FIG. 2 illustrates a specific behavior of the conversion device in accordance with FIG. 1.

FIG. 2 (A) shows an example of an initial test vector 15 in accordance with FIG. 1. An initial test vector set is generated from, for example, an automatic test pattern generator (ATPG) program. For the initial test vector 15, a target bit set 21 related to input bits is determined through the processes by the target internal line selection unit 3 and the target internal line distinction unit 5. The bit indicated as '*' is a bit preferable to be an unspecified value (don't-care) X. The bit indicated as '−' is a bit identified which must remain as a logic bit which is a logic value 1 or 0. The identification unit 7 performs an identification process of identifying a bit which must remain as a logic bit and a bit which can be an unspecified bit in the input bits. Here, it is supposed that a first target clock-control line has, for example, a logic value 1 (designated logic value) which activates a flip-flop group, and that a second target clock-control line has a logic value 0 (different logic value from the designated logic value) which inactivates a flip-flop group. Identification process is performed for achieving the effect of changing as many logic values 1 of first target internal lines into unspecified values as possible. At the same time, identification process is performed for achieving the effect of keeping as many logic values 0 of second target internal lines in order to prevent the second target internal lines from having logic values 1, too. Identification process is performed without deteriorating properties such as fault coverage by use of fault simulation. As a result, as shown in FIG. 2 (C), a set is obtained where the bits (obtained by the unspecified bit identification unit 11 in FIG. 1) which should be unspecified bits, rounded by squares, and the logic bits (obtained by the input logic bit identification unit 13 in FIG. 1), rounded by circles, are identified. From this set, a test cube set 17 such as a set shown in FIG. 2 (D) is obtained as a new set. A new test cube set 17 can change the logic value of a first target clock-control signal line from a logic value which activates a flip-flop group into a logic value which inactivates a flip-flop group, from 1 to 0 for example, without increase of the size or the test data volume and without deteriorating properties such as fault coverage, compared to those of the initial test vector set. Finally, the assignment unit 9 performs an assignment process where logic values 1 or 0 are assigned to unspecified logic values in the logic bits including the unspecified values identified by the above identification process, for the first target internal lines which are identified to have unspecified values to have logic values which inactivate flip-flop groups, 0 for example. Consequently, a final test vector set 19 as shown in FIG. 2 (E) is obtained.

If the given set has an unspecified (don't-care) bit, the target internal line distinction unit 5 can further distinguish a clock-control signal line having an unspecified value X as a third target internal line. Also, the identification unit 7 can perform an identification process of identifying logic bits and unspecified bits (including bits to be unspecified bits) for achieving the effect of keeping the unspecified values of third target clock-control signal lines or of changing the logic values into logic values 0 (logic values different from the logic values designated for the third target clock-control signal lines) in order to make as many third target clock-control signal lines to have logic values different from logic values 1. Then, the assignment unit 9 can perform an assignment process of assigning logic values 1 or 0 which inactivate flip-flop groups, 0 for example, if a third clock-control signal line has a kept unspecified value, to the unspecified value.

In the embodiment described above, clock-control signal lines are adopted as an example of target internal lines. However, target internal lines may be other signal lines in the logic circuit. And target internal lines may include different kinds of signal lines in the logic circuit.

In addition, in the embodiment described above, the logic values 1, of clock-control signal lines as an example of target internal lines, activate downstream flip-flop groups and the logic values 0 inactivate downstream flip-flop groups. However, the logic values which activate or inactivate the downstream flip-flops groups can differ by, for example, whether the outputs of a clock-control signal line and a clock signal are ANDed or ORed. Therefore, a target internal line can be decided as a first target internal line when it has a logic value designated for each line. Similarly, a target internal line can be decided as a second target internal line when it has a logic value different from the designated logic value.

In addition, the identification unit may identify a bit for achieving only a part of the effects for first target internal lines, second target internal lines, or third target internal lines. The identified bit may affect only a kind of the target internal lines or the combination of the target internal lines. Besides, the identified bit may affect only a part of first target internal lines if there are a plurality of first target internal lines. The same applies to second target internal lines and third target internal lines.

The present invention is further described in the following, referring to FIG. 1 and FIG. 2.

[The Basic Idea of CTX (Clock-Gating-Based Test Relaxation and X-Filling)]

Figure 3:
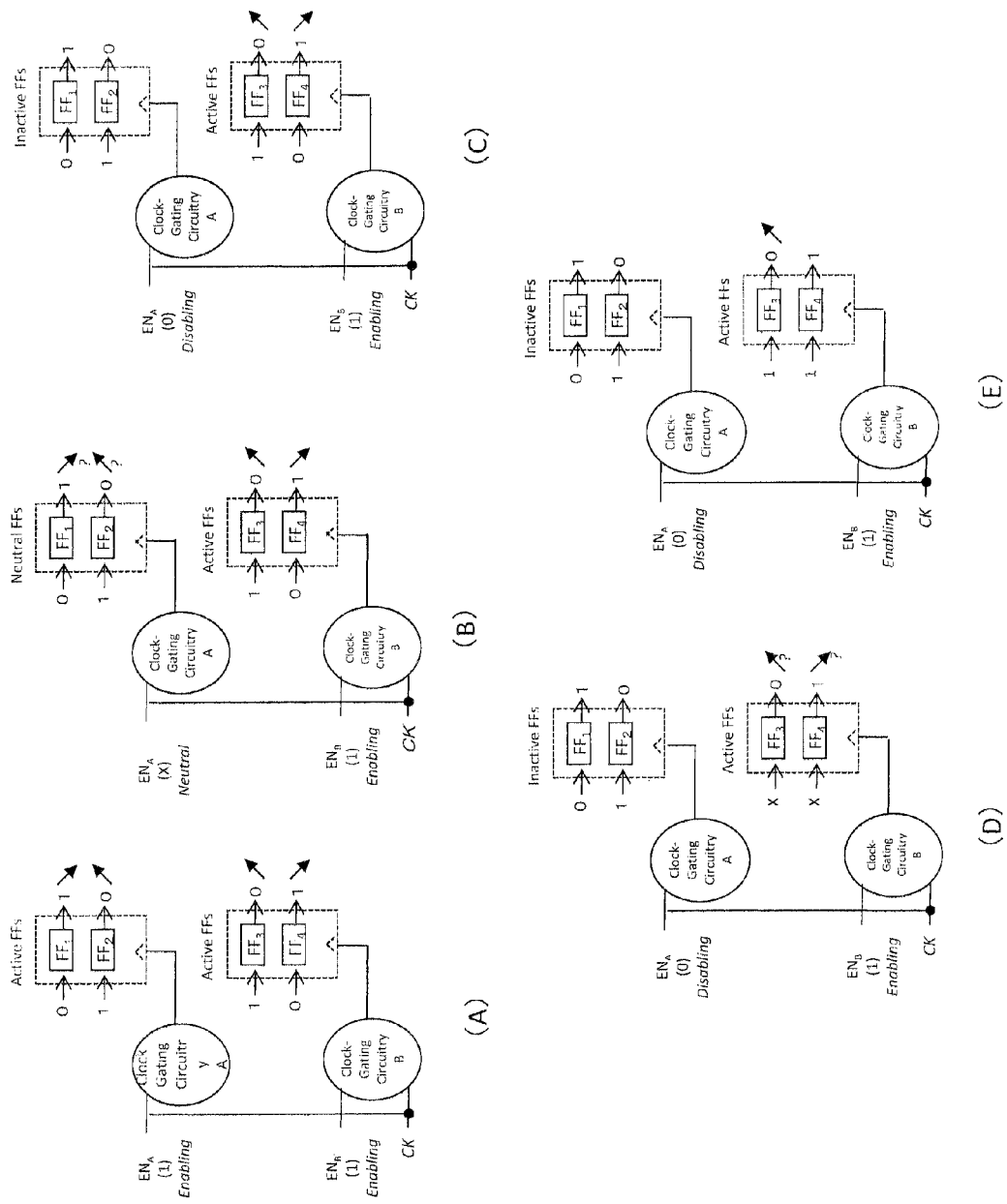
FIG. 3 illustrates the basic idea of CTX.
Figure 15:
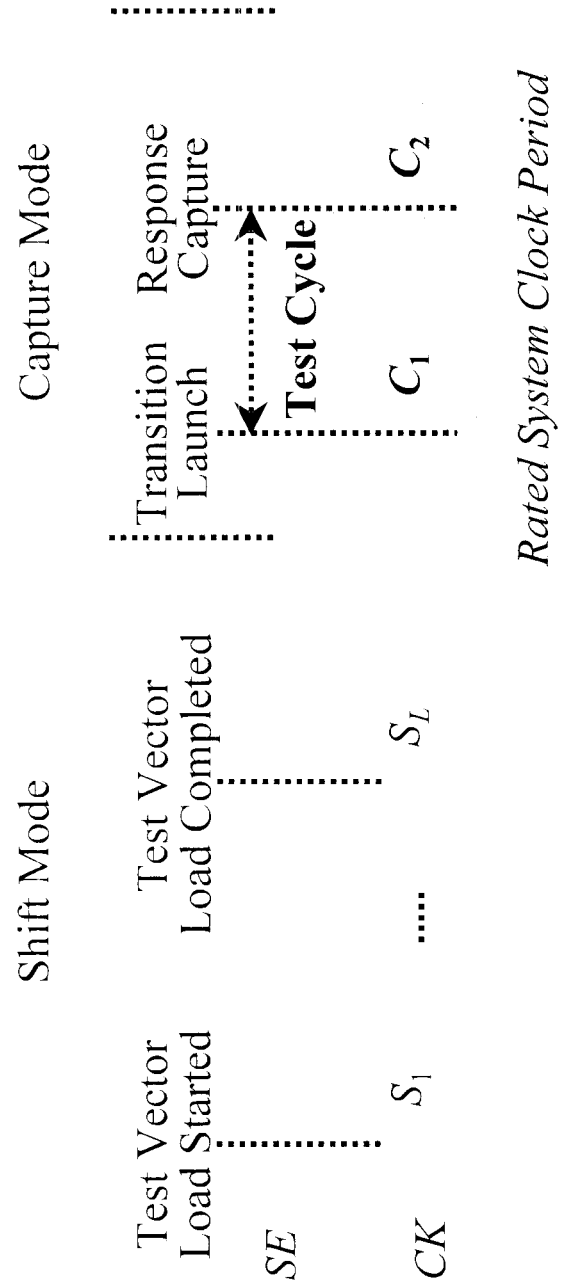
FIG. 15 illustrates an LOC clocking scheme.
Figure 16:
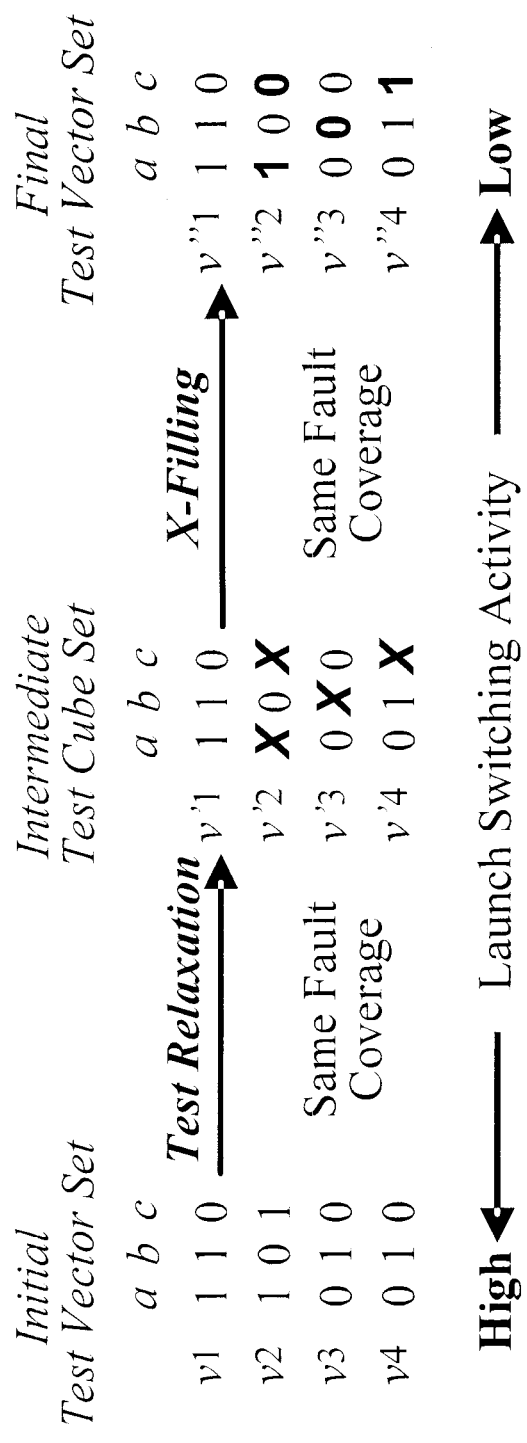
FIG. 16 illustrates the concept of test relaxation & X-filling.
Figure 17:
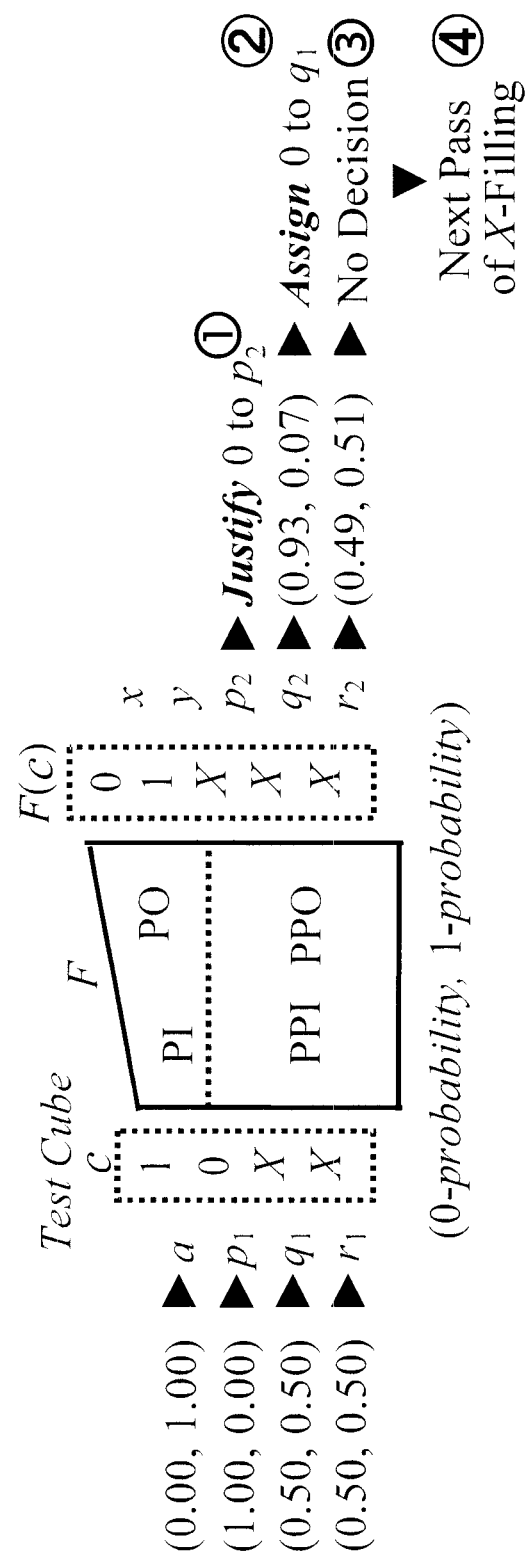
FIG. 17 illustrates one of many low-LSA X-filling techniques, called JP-fill.
Figure 18:
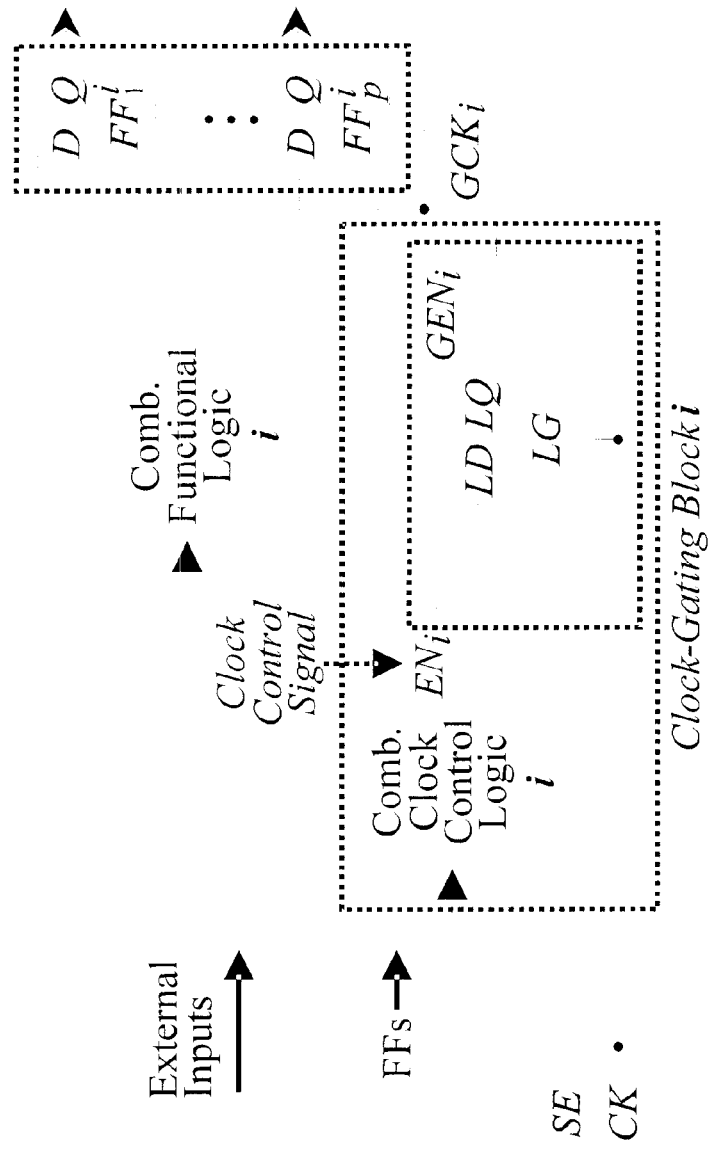
FIG. 18 illustrates an example of clock-gating schemes.
Figure 19:
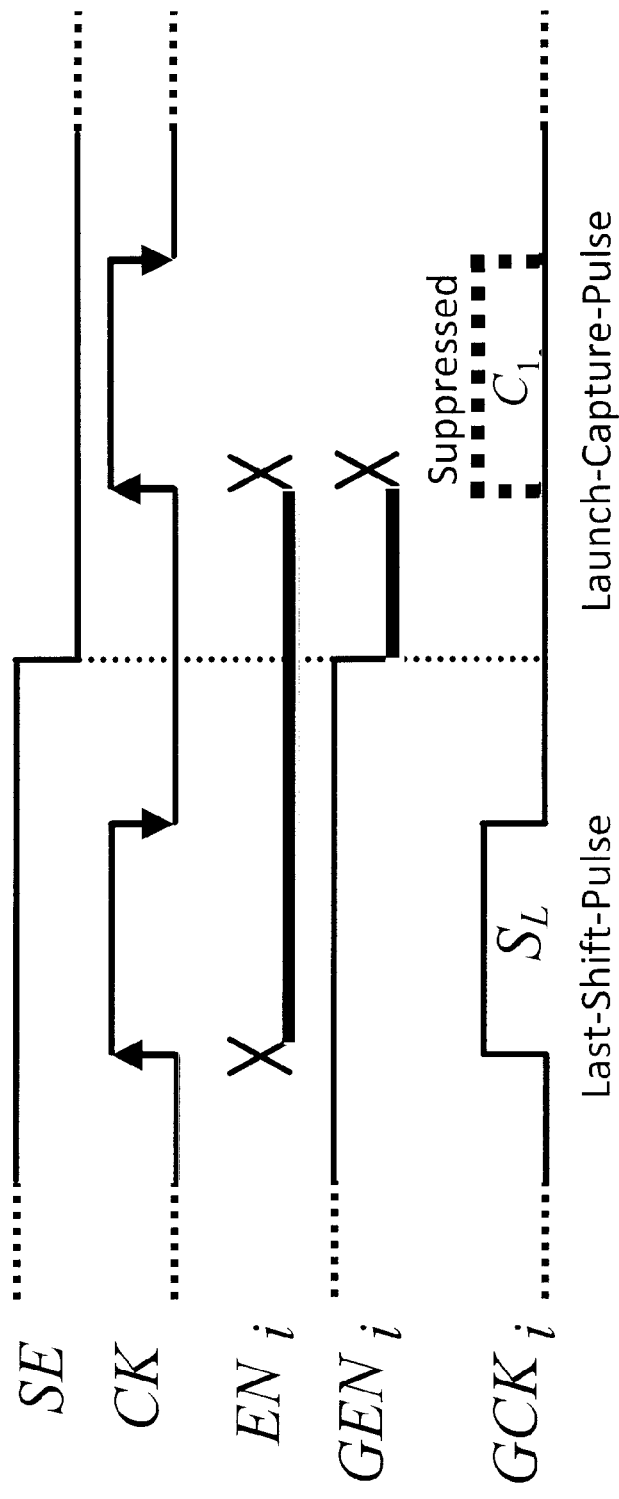
FIG. 19 illustrates a timing chart of signals related to a clock-gating circuit in FIG. 17.
Figure 20:
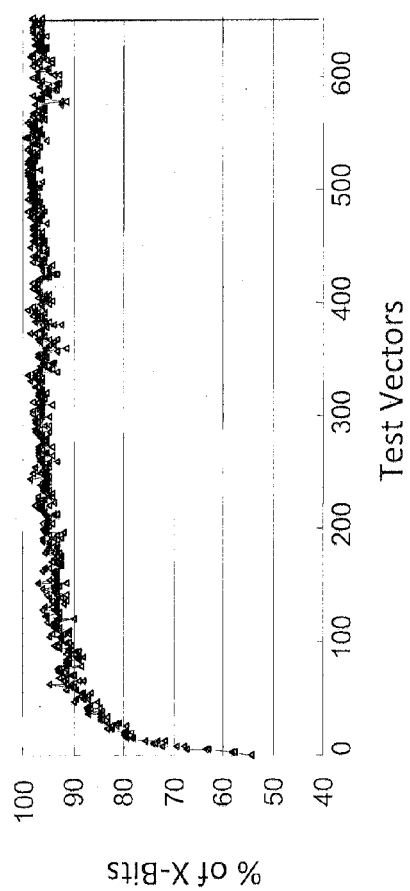
FIG. 20 shows a graph illustrating the ratio between the number of test vectors and the number of unspecified values X in an example of an industrial circuit (600K gates and 600 transition delay test vectors).

FIG. 3 illustrates the basic idea of CTX. Its basic idea is to make sophisticated use of clock-gating in test relaxation & X-filling, as illustrated in FIG. 3. FIG. 3 (A) shows that four flip-flops (abbreviated to 'FFs' in the following) are controlled by two clock-control signals, $EN_A$ and $EN_E$, whose values are 1 for the initial test vector. This means that all the FFs are active, i.e. capturing at $C_1$ (FIG. 15), resulting in four initial launch transitions. CTX consists of the following two stages.

<Stage-1 (Clock-Disabling)>

Test relaxation is first conducted to turn as many enabling clock-control signals (with value=1) as possible into neutral ones (with value=X) as shown in FIG. 3 (B), and X-filling is then conducted to turn as many neutral clock-control signals as possible into disabling ones (with value=0) as shown in FIG. 3 (C). Since all FFs controlled by a disabling clock-control signal (e.g., $FF_1$ and $FF_2$, in FIG. 3 (C)) are inactive, launch transitions are efficiently reduced in a collective manner.

<Stage-2 (Input-Output-Equalizing)>

Test relaxation is conducted to turn as many active transition-FFs (input≠output, e.g., $FF_3$ and $FF_4$ in FIG. 3 (C)) as possible into neutral-FFs (input or output=X, e.g., $FF_3$ and $FF_4$ in FIG. 3 (D)), and then X-filling is conducted to turn as many neutral-FFs as possible into non-transition-FFs (input=output, e.g., $FF_4$ in FIG. 3 (E)) by input-output-equalizing. This way, the number of launch transitions at individual FFs is reduced. The techniques proposed in other applications by the present inventors are utilized in the process of this stage-2.

The major contributions of the CTX scheme are as follows. (1) Clock-Disabling-Based Test Relaxation & X-Filling: CTX fully explores the collective power-saving capability of clock-gating in at-speed scan testing. (2) Input-Output-Equalizing-Based Test Relaxation & X-Filling: CTX equalizes the input and output values of the remaining active FFs to further reduce launch transitions at individual FFs. (3) Non-Intrusive Use of Clock-Gating: By using clock-gating through test data manipulation, CTX causes no ATPG change, test data inflation, or fault coverage loss. (4) X-Bit-Efficiency: With clock-disabling and input-output equalizing, CTX significantly reduces launch switching activity even with a small number of few X-bits.

[Problem Formalization]

The problem of clock-gating-based reduction of launch switching activity in at-speed scan testing is as follows:

Suppose that $V_{initial}$ is a set of test vectors. Find a new set of test vectors, $V_{final}$, under the following conditions: (1) The fault coverage of $V_{final}$ is no less than that of $V_{initial}$. (2) The size of $V_{final}$ is equal to that of $V_{initial}$. (3) The peak launch switching activity of $V_{final}$ is made lower than that of $V_{initial}$ as much as possible by utilizing clock-disabling and input-output-equalizing.

[Basic Concept]

Here is a proposition of a novel two-stage scheme, namely CTX (Clock-Gating-Based Test Relaxation and X-Filling), to solve the above problem. The following are useful terms in describing the procedure of CTX.

Definition A: If the value of a clock-control signal EN under an input vector is logic value 1 (0), EN is said to be enabling (disabling). If the value is X, EN is said to be neutral. For example, $EN_A$ in FIGS. 3 (A), (B), and (C) are enabling, neutral, and disabling clock-control signals, respectively.

Definition B: If the clock to a FF or a clock-gated FF group is enabled (disabled), the FF or the clock-gated FF group is said to be active (inactive). For example, $FF_1$ and $FF_2$ ($FF_3$ and $FF_4$) in FIG. 3 (C) are inactive (active) FFs. It can also be said that the clock-gated FF group $\{FF_1, FF_2\}$ ($\{FF_3, FF_4\}$) is inactive (active).

Definition C: If the input and the output of a FF have the same (different) logic value, the FF is said to be a non-transition-FF (transition-FF). If the input or the output of a FF is X, the FF is said to be a neutral-FF. For example, both $FF_3$ and $FF_4$ in FIG. 4 (d) are neutral-FFs. In FIG. 3 (E), $FF_3$ is a transition-FF, $FF_4$ is a non-transition-FF, and both of them are active.

CTX is based on the following two observations.

Observation-1: Not all enabling clock-control signals really need to be enabling. This occurs when a clock-control signal is made enabling to detect a fault in a test vector, but later the fault may be detected by another test vector that does not require the clock-control signal to be enabling.

Observation-2: Even if only one FF needs to be active for fault detection, all other FFs in the same clock-gated FF group also have to be active since they share the same clock-control signal. This results in redundant transitions especially when clock-gating is coarse-grained.

Figure 4:
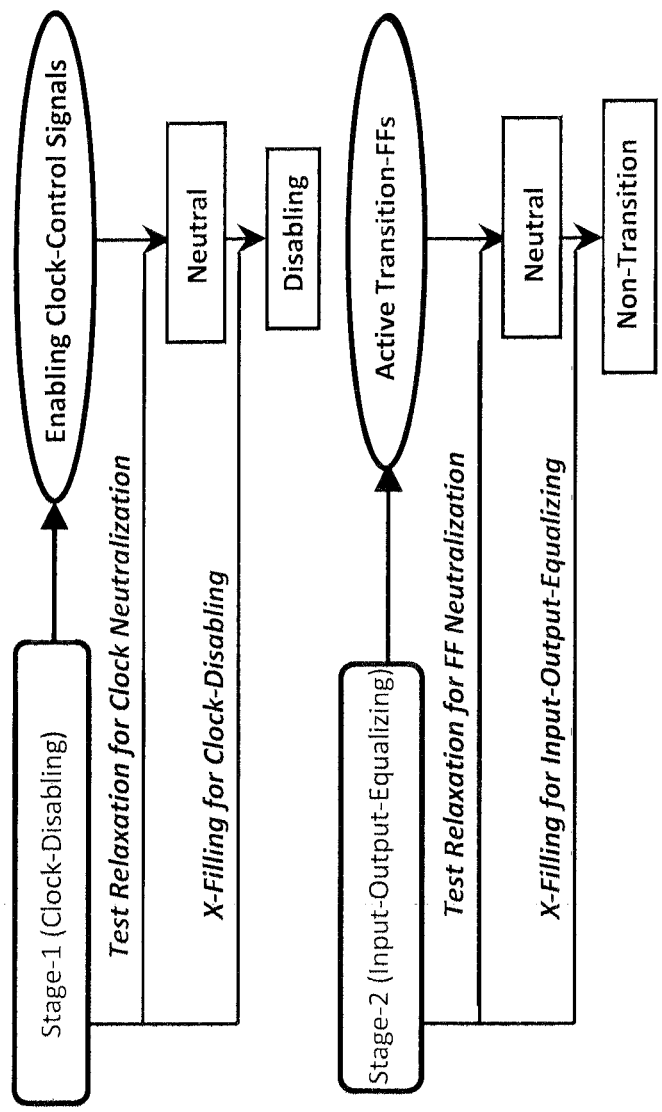
FIG. 4 illustrates flowchart showing the basic concept of CTX.

The basic concept of CTX is summarized in a flowchart in FIG. 4.

The first observation leads to the Stage-1 (Clock-Disabling) of CTX as shown in FIG. 4. Test relaxation is conducted to turn as many enabling clock-control signals as possible into neutral ones, and then X-filling is conducted to make as many neutral clock-control signals as possible into disabling ones. This way, launch switching activity can be reduced efficiently at the clock-gated FF group level, due to the collective reduction capability of clock gating.

The second observation leads to the Stage-2 (Input-Output-Equalizing) of CTX as shown in FIG. 4. Test relaxation is conducted to turn as many active transition-FFs as possible into neutral-FFs, and then X-filling is conducted to make as many neutral-FFs as possible into non-transition-FFs. This way, launch switching activity can be further reduced at the individual FF level.

[Circuit Model]

Figure 5:
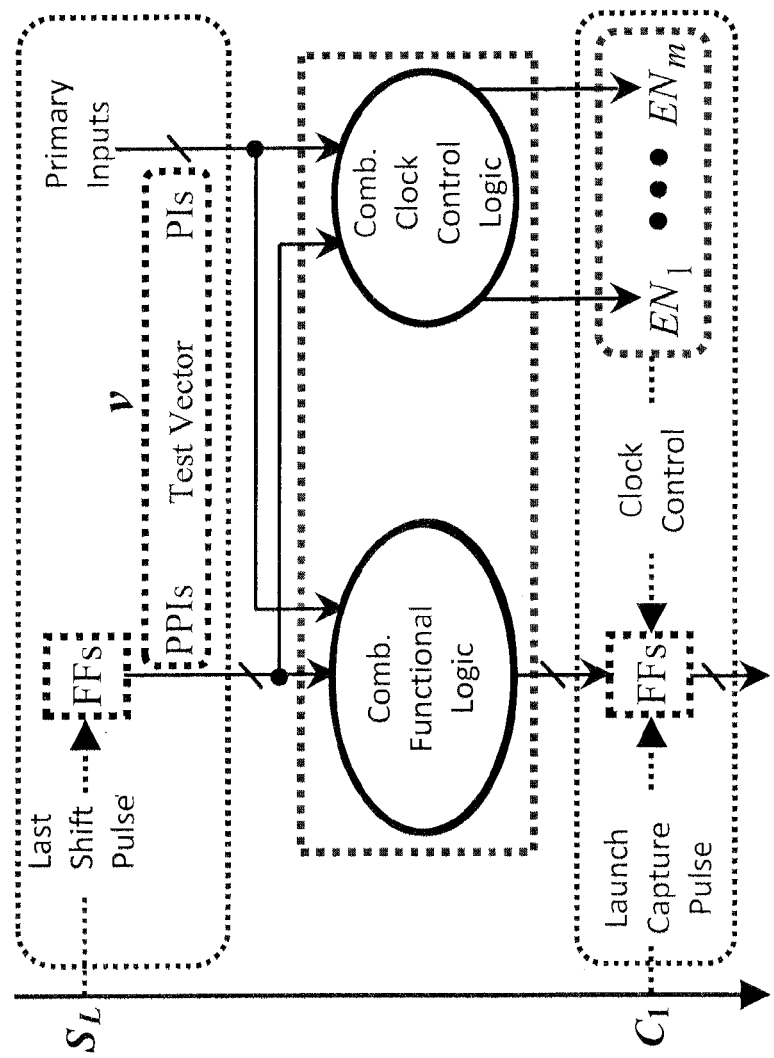
FIG. 5 shows the model of a circuit containing m clock-gating blocks, for the purpose of test generation for CTX.

FIG. 5 shows the model of a circuit containing m clock-gating blocks, for the purpose of test generation for CTX.

As shown in FIG. 5, a fully-specified test vector v is loaded at the rising edge of the last shift pulse $S_L$. v consists of the PPI part <v: PPI> corresponding to the outputs of FFs, and the PI part <v: PI> corresponding to primary inputs. The combinational clock-control logic circuitry produces m clock-control signals, $EN_1$, $EN_2$, $EN_m$, corresponding to the m clock-gating blocks as the one shown in FIG. 5. Each of the clock-control signals may be disabling or enabling, and determines whether the corresponding clock-gated FF group is active or not at the launch capture pulse $C_1$.

[CTX Procedure]

Based on the basic concept of CTX shown in FIG. 4, the CTX procedure can be described as follows.

Input: $V^0=\{v^0_i|i=1, 2, \ldots, n\}$//initial test set
Output: $V^2=\{v^2_i|i=1, 2, \ldots, n\}$//final test set <Stage-1 (Clock-Disabling)>

(1-1) Obtain RS $(v^0_i)=\{$bits in $v^0_i$ that are reachable from at least one enabling clock-control signal under $v^0_i\}$ for i=1, 2, ..., n.

(1-2) Obtain $T^1$=RS $(v^0_1)$ U RS $(v^0_2)$ ... U RS $(v^0_n)$.

(1-3) Conduct constrained test relaxation on $V^0$ to turn as many bits in $T^1$ into X-bits as possible, while preserving the fault coverage of $V^0$. Denote the set of resulting partially-specified test cubes by $C^1=\{c^1_i|i=1, 2, \ldots, n\}$.

(1-4) Try to justify 0 on each neutral clock-control signal under $c^1_i$ by setting appropriate logic values to some X-bits in $c^1_i$ for i=1, 2, ..., n.

(1-5) Conduct low-LSA X-filling for the remaining X-bits in $c^1_i$ for i=1, 2, ..., n. Denote the set of resulting fully-specified test vectors by $V^1=\{v^1_i|i=1, 2, \ldots, n\}$.

<Stage-2 (Input-Output-Equalizing)>

(2-1) Obtain RF $(v^1_i)=\{$bits in $v^1_i$ that correspond to active transition-FFs under $v^1_i\}$ for i=1, 2, ..., n.

(2-2) Obtain $T^2$=RF$(v^1_1)$ U RF$(v^1_2)$ U RF$(v^1_n)$.

(2-3) Conduct constrained test relaxation on $V^1$ to turn as many bits in $T^2$ into X-bits as possible, while preserving (1) fault coverage of $V^1$ and (2) the logic value of any clock-control signal. Denote the set of resulting partially-specified test cubes by $C^2=\{c^2_i|i=1, 2, \ldots, n\}$.

(2-4) Conduct low-LSA X-filling for the X-bits in $c^2_i$ for i=1, 2, ..., n. Denote the set of resulting fully-specified test vectors by $V^2=\{v^2_i|i=1, 2, \ldots, n\}$.

[Constrained Test Relaxation]

Figure 6:
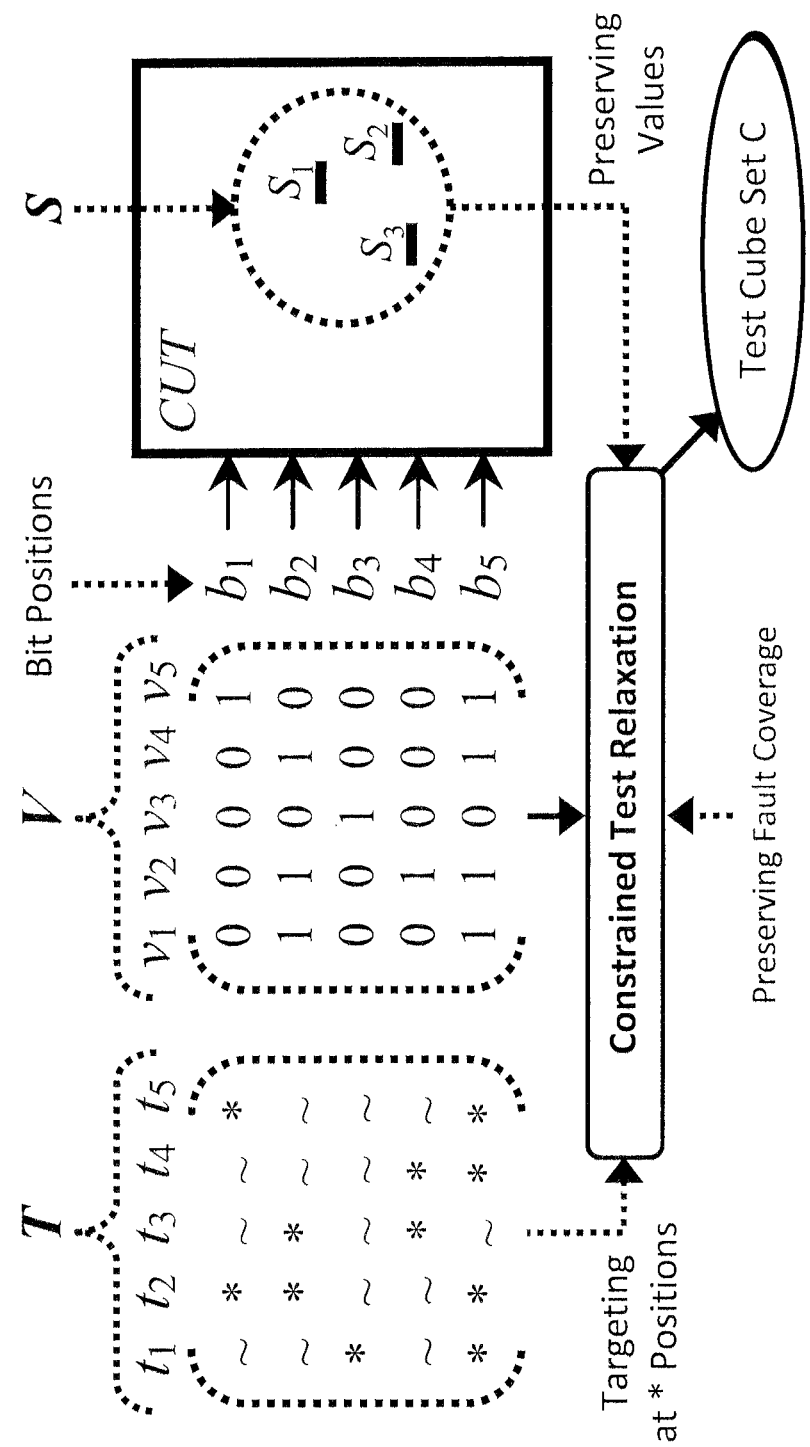
FIG. 6 illustrates a procedure of constrained test relaxation.

The key operation in CTX described is constrained test relaxation conducted on a fully-specified test set V to turn as many target bits in T into X-bits as possible, while preserving (1) the fault coverage of V and (2) the logic values of target lines in S. The result is C, a set of partially-specified test cubes. This is illustrated in FIG. 6, where * indicates a target bit position. Note that, only fault coverage needs to be preserved in the constrained test relaxation of Step (1-3), where S=can be assumed.

[Procedure of Constrained Test Relaxation]

FIG. 6 illustrates a procedure of constrained test relaxation.

Referring to FIG. 6, input V is a set of fully-specified test vectors. T is a set of target bits. S is a set of target lines (=in (1-3) of CTX). Output C is a set of resulting partially-specified test cubes.

Step S-1: Identify all essential faults of V, each of which can only be detected by one test vector in V, by an efficient procedure based on two passes of fault simulation.

Step S-2: Identify all bits in V whose logic values are needed for (1) detecting all essential faults and (2) preserving logic values of all target lines in S, in such a manner that bits in T are avoided as much as possible. Such bits can be readily found by making use of the justification also widely applied in ATPG. Then, turn the identified bits in V into X-bits, and this results in an intermediate test cube set, C'.

Step S-3: Conduct 3-valued fault simulation on C' for all non-essential faults of V. For all undetected non-essential faults, identify the X-bits whose logic values in V are needed for detecting them, in such a manner that bits in T are avoided as much as possible. Then, restore the identified X-bits with their original logic values in V. This results in the final test cube set, C.

The time complexity of the constrained test relaxation procedure is O(M×N), where M and N as the number of faults and the number of test vectors, respectively.

[Experimental Results]

FIG. 7 illustrates two tables showing experimental results.

The CTX test generation scheme was implemented in C for evaluation experiments. Since there are no available benchmark circuits with gated clocks, we created two test circuits, TC-1 and TC-2, by synthesizing the open-source microprocessor design picoJava (registered trademark). Note that one clock-gating block corresponds to one clock-gated FF group. Evaluation experiments were conducted on TC-1 and TC-2, and the results are summarized in the Table of FIG. 7 (B). Transition LOC delay test vectors were generated by Tetra-MAX (registered trademark). Test vector count and fault coverage are shown under "# of Vec." and "Fault Cov. (%)", respectively. Three experiments were conducted using (1) XID with Preferred-Fill, (2) XID with JP-Fill, and (3) the proposed CTX scheme, where XID is a test relaxation system developed without using gated clocks. Reduction ratio of launch switching activity w.r.t. the original test set, measured by the WSA metric, are shown under "XID+Preferred", "XID+JP", and "CTX", respectively. The Table of 7 (B) shows that the CTX scheme is more effective than the previous schemes based on conventional test relaxation and X-filling. It also shows that CTX is especially effective for low-power devices, in which the clock-gating mechanism is massively used.

The following can be said from the experimental results:

(1) CTX is non-intrusive in reducing yield loss risk for at-speed scan testing, in that CTX causes no test data inflation, no fault coverage loss, no circuit/clocking modification, and no circuit performance degradation. This makes CTX a preferred part of any power-safe test generation flow. (2) CTX is applicable to test compaction and test compression where the numbers of X-bits in a test cube are limited. CTX makes up for such X-bit shortage by making full use of clock-gating, in a sophisticated manner that the original test vector count does not change.

[Conclusions]

Described above is a proposition of a novel two-stage scheme, namely CTX (Clock-Gating-Based Test Relaxation and X-Filling), for effectively reducing launch switching activity that may cause yield loss in at-speed scan testing. The basic idea is to use clock-gating to disable as many as possible FFs that do not contribute to fault detection. CTX is the first of its kind that makes full use of clock-gating in test relaxation and X-filling. CTX reduces yield loss risk without any impact on test size, fault coverage, ATPG, circuit or clock design, and functional performance. Furthermore, CTX is applicable to any test compression schemes where X-bits are limited.

Figure 8:
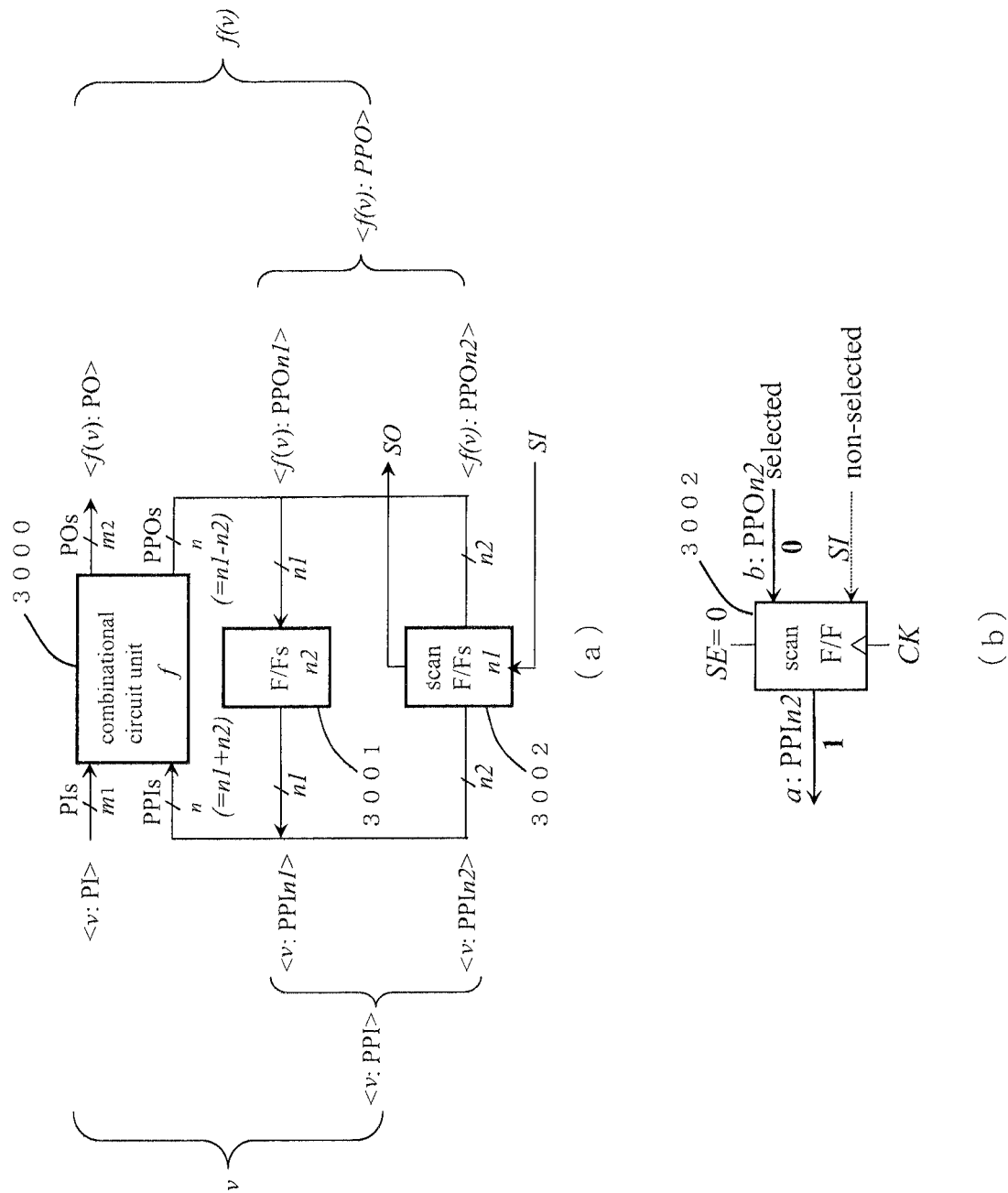
FIG. 8 illustrates a partial scan circuit.
Figure 9:
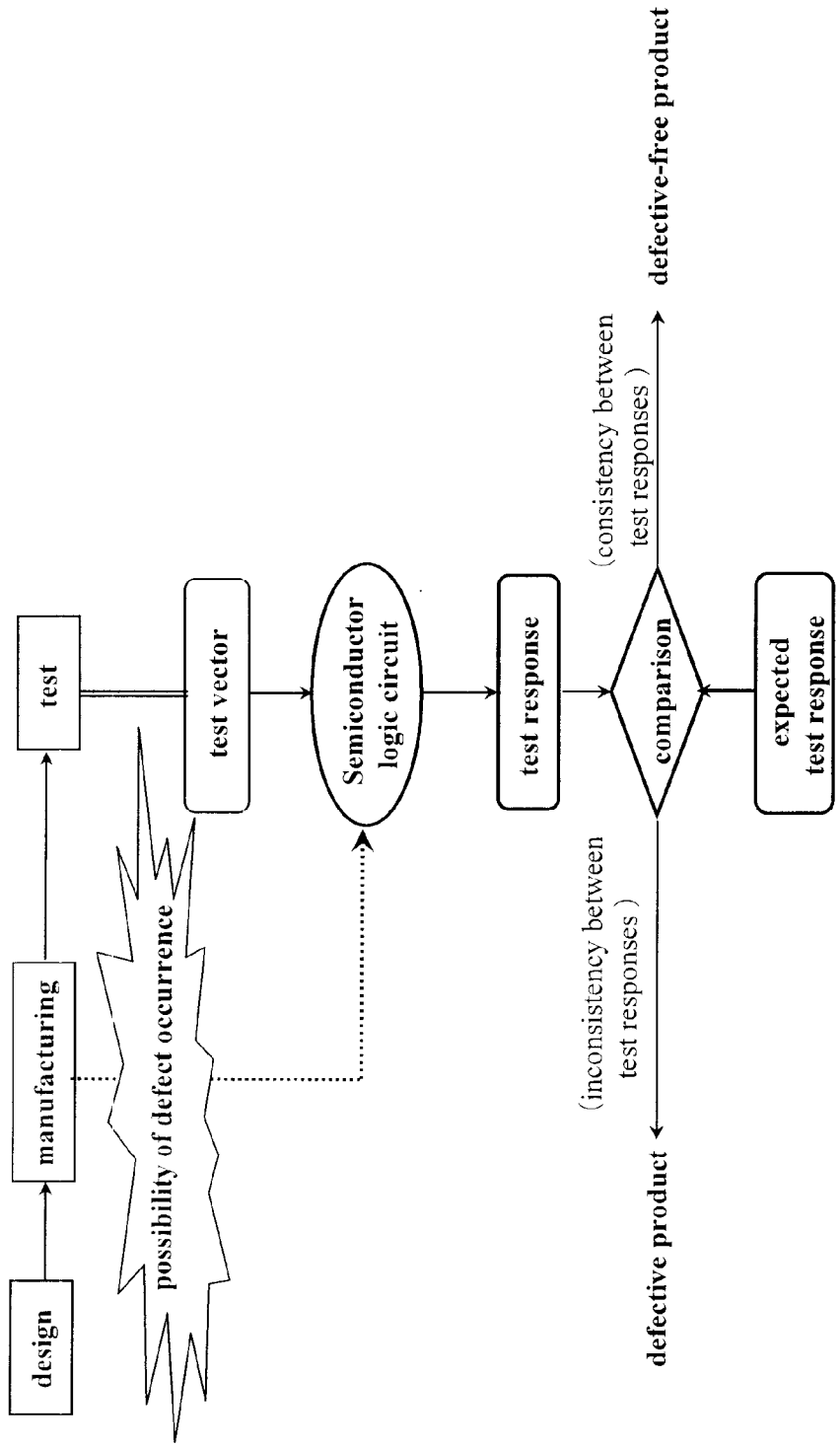
FIG. 9 illustrates steps of design, manufacturing and test before a semiconductor logic circuit is shipped to the market.
Figure 10:
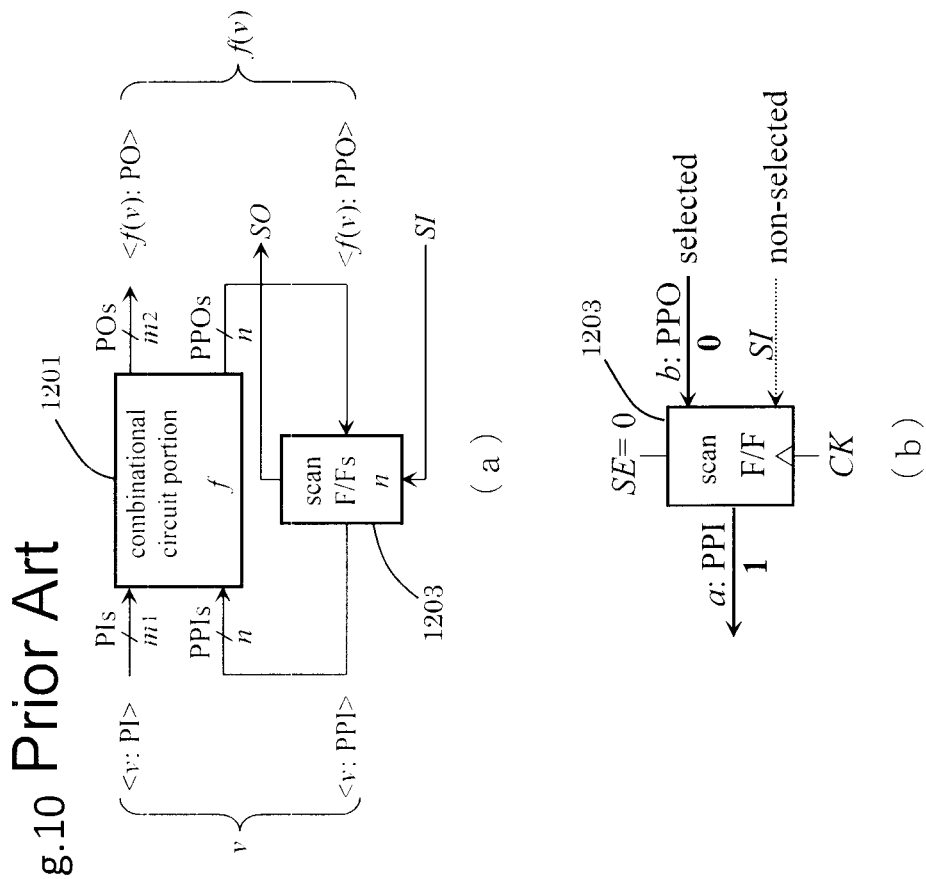
FIG. 10 illustrates a full scan sequential circuit of a common logic circuit.
Figure 11:
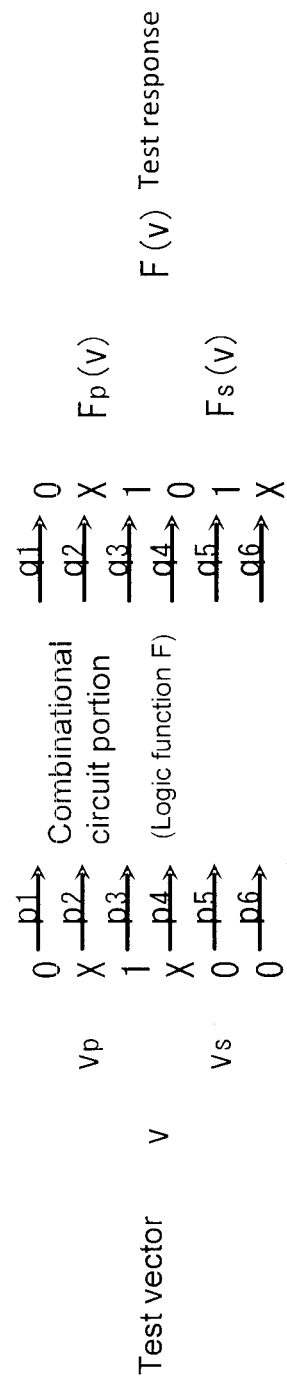
FIG. 11 illustrates the relationship between the test input and the test response.
Figure 13:
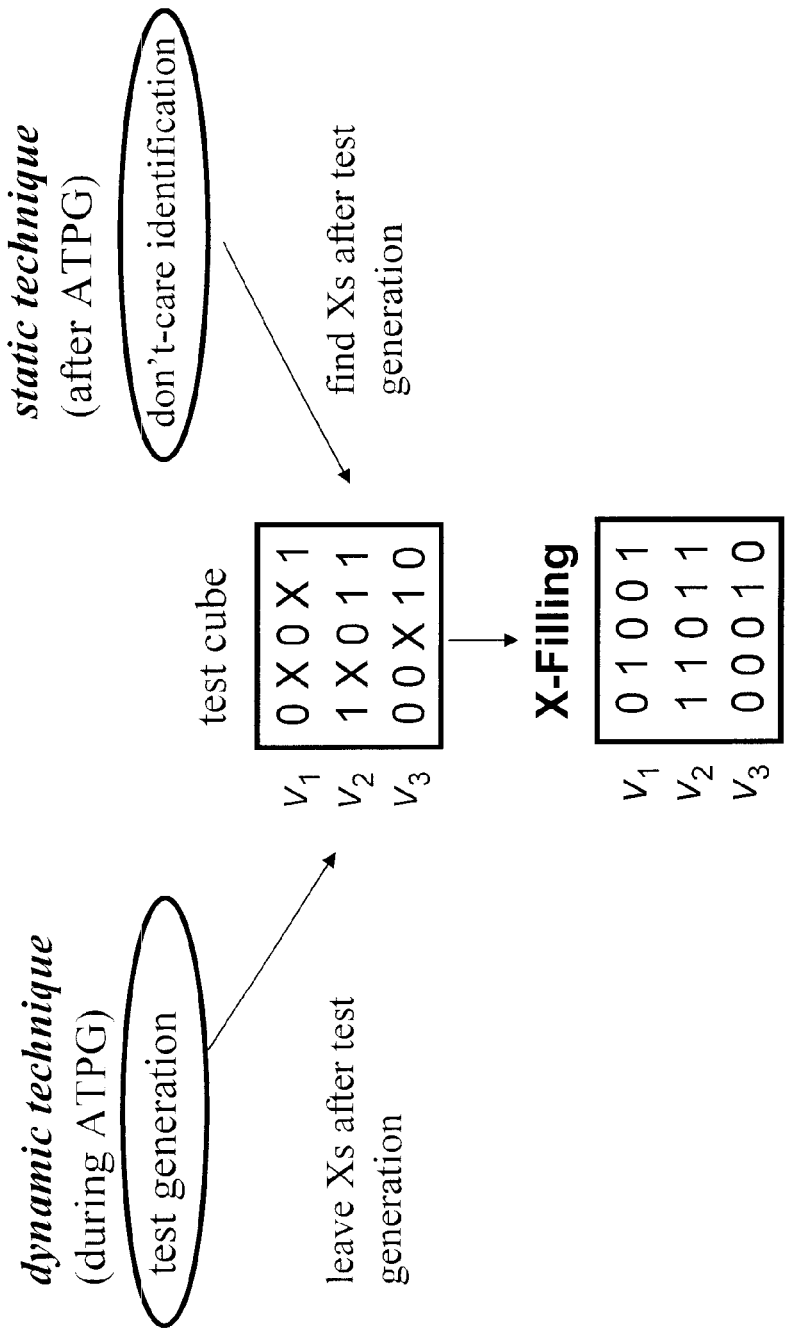
FIG. 13 illustrates the concept of obtaining a test cube and an example of test data manipulation.
Figure 14:
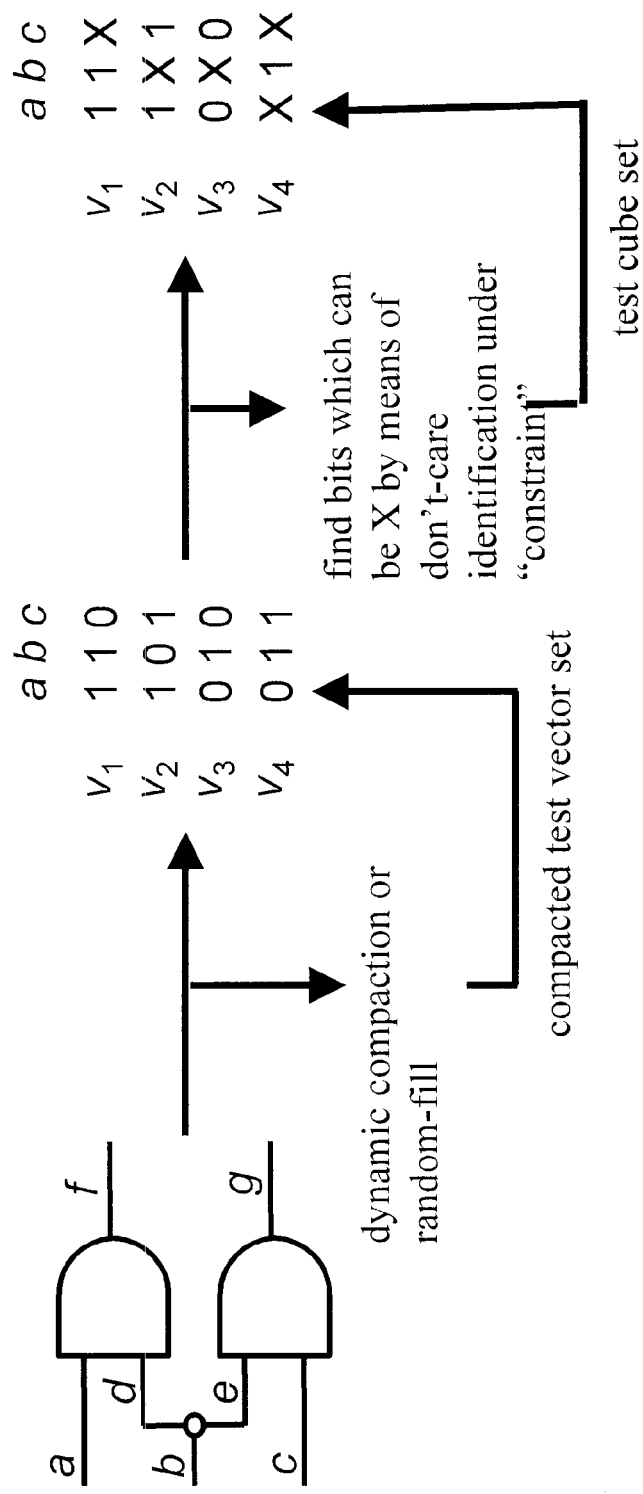
FIG. 14 illustrates a simple example of test relaxation (don't-care identification).

In the above, the present invention is described as for a full scan sequential circuit as shown in FIG. 10. However, it is also applicable to a partial scan circuit as shown in FIG. 8. Here, a partial scan circuit is a circuit with only a part of flip-flops replaced by scan flip-flops which form one or a plurality of scan chains. The present invention is also applicable to a pipelined sequential circuit.

Concretely speaking, the circuit includes a combinational circuit unit 3000, a flip-flop 3001 of a sequential circuit and a scan flip-flop 3002 of a partial scan sequential circuit. The combinational circuit unit 3000 is the same with the combinational circuit portion 1201 in FIG. 10. The input of the combinational circuit unit 3000 includes <v: PPI> consisting of <v: PPIn2> which are set in a scan flip-flop 3002 by scan shift and <v: PPIn1> which are set in a flip-flop 3001. The output of the combinational circuit unit 3000, like the combinational circuit portion 1201 in FIG. 10, consists of <f(v): PO> which appear on the primary output directly as a test response f(v) to a test vector v and <f(v): PPO> which appear on the pseudo primary output. <f(v): PPO> consists of <f(v): PPOn2> which are captured into the scan flip-flop 3002 and <f(v): PPOn1> which are captured into the flip-flop 3001.

FIG. 8 (b) illustrates an example of conflict occurrence between logic values before and after scan capture in the scan flip-flop 3002 in FIG. 8 (a).

In FIG. 8 (b), as well as in FIG. 10 (b), conflict of logic values (denoted as transition in the following) in capture mode occurs in scan flip-flop 3002 when the logic value of bit a which is an element of test vector <v: PPIn2> and the logic value of its test response <f(v): PPOn2> differ. The number of transitions occurred by a test vector deeply affects the power consumed due to the test vector in the whole circuit including the combinational circuit unit 3000. Therefore, the power consumed in capture mode can be reduced by reducing the number of transitions in capture mode occurred by a test vector. Such a procedure is conducted in Stage-2 (Input-Output-Equalizing) shown in FIG. 4.

In the above, the combinational circuit portion of a full scan sequential circuit and the combinational circuit unit of a partial scan circuit are shown as examples of the logic circuits being the target of fault detection. However, the present invention can be applicable to other logic circuits such as a pipelined logic circuit.

DESCRIPTION OF SYMBOLS

7 Identification unit
9 Assignment unit
11 Unspecified bit identification unit
13 Input logic bit identification unit

The invention claimed is:

1. A generation device for generating a new set from a given set with fault model of the given set preserved or with fault coverage of the given set preserved or enhanced, the given set comprising input bits to be applied to a logic circuit being the target of fault detection, the given set being a test vector set consisting of test vectors whose input bits are logic bits of logic value 1 or 0, a test cube set consisting of test cubes whose input bits include one or more unspecified bits whose logic values are not specified, or a combination set consisting of both test vectors and test cubes, comprising:

a target internal line selection unit that selects a signal line in the logic circuit;

a target internal line distinction unit that distinguishes the signal lines in the logic circuit in terms of logic values of the signal lines; and an identification unit that identifies an input bit that must remain as a logic bit and an input bit that can be an unspecified bit, wherein the signal line in the logic circuit is connected to a downstream circuit, and the identification unit achieves an effect on the signal lines which are selected by the target internal line selection unit and which are distinguished between a first target internal line, a second target internal line and a third target internal line by the target internal line distinction unit, with at least the fault model of the given set preserved or with fault coverage of the given set preserved or enhanced, the effect being:

(a) changing at least one designated logic value of the first target internal line into an unspecified value, the first target internal line being the signal line in the logic circuit with a logic value which activates the downstream circuit and which is the same as the logic value designated for the signal line;

(b) keeping at least one logic value of the second target internal line, the logic value being different from the designated logic value for the second target internal line, the second target internal line being the signal line in the logic circuit with a logic value which inactivates the downstream circuit and which is different from the logic value designated for the signal line; or (c) keeping at least one unspecified value of the third target internal line or changing at least one unspecified value of the third target internal line into a logic value being different from the logic value designated for the third target internal line, the third target internal line being a signal line in the logic circuit with an unspecified value.

2. The generation device of claim 1, wherein the downstream circuit is a flip-flop group and the target internal line in the logic circuit controls the flip-flop group.

3. The generation device of claim 2, further comprising an assignment unit that assigns a logic value 1 or 0 to an unspecified input bit including unspecified bit identified by the identification device, wherein the assignment unit assigns a logic value 1 or 0 to an unspecified input bit so that:

(a) a logic value different from the logic value designated for the first target internal line whose value can be changed into an unspecified logic value appears at the first target internal line; or
(b) a logic value different from the logic value designated for the third target internal line appears at the third target internal line.

4. A generation method for generating a new set from a given set with fault model of the given set preserved or with fault coverage of the given set preserved or enhanced, the given set comprising input bits to be applied to a logic circuit being the target of fault detection, the given set being a test vector set consisting of test vectors whose input bits are logic bits of logic value 1 or 0, a test cube set consisting of test cubes whose input bits include one or more unspecified bits whose logic values are not specified, or a combinational set consisting of both test vectors and test cubes, comprising the steps of:

selecting a signal line in the logic circuit;
distinguishing the signal lines in the logic circuit in terms of logic values of the signal lines; and
identifying an input bit that must remain as a logic bit and an input bit that can be an unspecified bit,
wherein the signal line in the logic circuit is connected to a downstream circuit, and
the identifying achieves an effect on the signal lines which are selected in the selecting and which are distinguished between a first target internal line, a second target internal line and a third target internal line in the distinguishing, with at least the fault model of the given set preserved or with fault coverage of the given set preserved or enhanced, the effect being:
(a) changing at least one designated logic value of the first target internal line into an unspecified value, the first target internal line being the signal line in the logic circuit with a logic value which activates the downstream circuit and which is the same as the logic value designated for the signal line;
(b) keeping at least one logic value of the second target internal line, the logic value being different from the designated logic value for the second target internal line, the second target internal line being the signal line in the logic circuit with a logic value which inactivates the downstream circuit and which is different from the logic value designated for the signal line; or
(c) keeping at least one unspecified value of the third target internal line or changing at least one unspecified value of the third target internal line into a logic value being different from the logic value designated for the third target internal line, the third target internal line being a signal line in the logic circuit with an unspecified value.

5. The generation method of claim 4,
wherein the downstream circuit is a flip-flop group and the target internal line in the logic circuit controls the flip-flop group.

6. The generation method of claim 5, further comprising the step of assigning a logic value 1 or 0 to an unspecified input bit including unspecified bit identified in the identifying so that:
(a) a logic value different from the logic value designated for the first target internal line whose value can be changed into an unspecified logic value appears at the first target internal line; or
(b) a logic value different from the logic value designated for the third target internal line appears at the third target internal line.

7. A generation method, implemented in a computer, for generating a new set from a given set with fault model of the given set preserved or with fault coverage of the given set preserved or enhanced, the given set comprising input bits to be applied to a logic circuit being the target of fault detection, the given set being a test vector set consisting of test vectors whose input bits are logic bits of logic value 1 or 0, a test cube set consisting of test cubes whose input bits include one or more unspecified bits whose logic values are not specified, or a combinational set consisting of both test vectors and test cubes, comprising the steps of:

selecting a signal line in the logic circuit;
distinguishing the signal lines in the logic circuit in terms of logic values of the signal lines; and
identifying an input bit that must remain as a logic bit and an input bit that can be an unspecified bit,
wherein the signal line in the logic circuit is connected to a downstream circuit, and
the identifying achieves an effect on the signal lines which are selected in the selecting and which are distinguished between a first target internal line, a second target internal line and a third target internal line in the distinguishing, with at least the fault model of the given set preserved or with fault coverage of the given set preserved or enhanced, the effect being:
(a) changing at least one designated logic value of the first target internal line into an unspecified value, the first target internal line being the signal line in the logic circuit with a logic value which activates the downstream circuit and which is the same as the logic value designated for the signal line;
(b) keeping at least one logic value of the second target internal line, the logic value being different from the designated logic value for the second target internal line, the second target internal line being the signal line in the logic circuit with a logic value which inactivates the downstream circuit and which is different from the logic value designated for the signal line; or
(c) keeping at least one unspecified value of the third target internal line or changing at least one unspecified value of the third target internal line into a logic value being different from the logic value designated for the third target internal line, the third target internal line being a signal line in the logic circuit with an unspecified value.

* * * * *